(12) United States Patent
Fujita

(10) Patent No.: US 10,256,336 B2
(45) Date of Patent: Apr. 9, 2019

(54) SEMICONDUCTOR DEVICE

(71) Applicant: Mitsubishi Electric Corporation, Tokyo (JP)

(72) Inventor: Koichi Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/879,564

(22) Filed: Oct. 9, 2015

(65) Prior Publication Data

US 2016/0181413 A1 Jun. 23, 2016

(30) Foreign Application Priority Data

Dec. 17, 2014 (JP) ................................. 2014-255382

(51) Int. Cl.
*H01L 29/40* (2006.01)
*H01L 29/78* (2006.01)
(Continued)

(52) U.S. Cl.
CPC ...... *H01L 29/7802* (2013.01); *H01L 29/0607* (2013.01); *H01L 29/1095* (2013.01);
(Continued)

(58) Field of Classification Search
CPC . H01L 29/407; H01L 29/7802; H01L 29/408; H01L 29/42356; H01L 29/66553;
(Continued)

(56) References Cited

U.S. PATENT DOCUMENTS 5,973,360 A 10/1999 Tihanyi
6,555,873 B2 4/2003 Disney et al.
(Continued)

FOREIGN PATENT DOCUMENTS

JP S63-102368 A 5/1988
JP S63-266882 A 11/1988
(Continued)

OTHER PUBLICATIONS

An Office Action; "Notice of Reasons for Rejection," mailed by the Japanese Patent Office dated Aug. 29, 2017, which corresponds to Japanese Patent Application No. 2014-255382 and is related to U.S. Appl. No. 14/879,564; with partial English Translation.
(Continued)

*Primary Examiner* — Yu Chen
(74) *Attorney, Agent, or Firm* — Studebaker & Brackett PC

(57) ABSTRACT

A semiconductor device is provided with an N⁻-type drift layer, a P⁺-type diffusion well region provided on a surface part of the N⁻-type drift layer, a P-type channel well region, an N⁺-type diffusion well region, a gate insulating film, a gate electrode laminated on the gate insulating film, a drain trench, a field plate provided in the drain trench with a silicon oxide film and an insulating film interposed therebetween and a field plate electrode formed on the field plate. The field plate is tapered toward a base part of the drain trench. A distance between a side wall of the drain trench and a side face of the field plate is increased toward the base part side.

15 Claims, 9 Drawing Sheets

(51) Int. Cl.
*H01L 29/739* (2006.01)
*H01L 29/10* (2006.01)
*H01L 29/417* (2006.01)
*H01L 29/66* (2006.01)
*H01L 29/06* (2006.01)

(52) U.S. Cl.
CPC .......... *H01L 29/402* (2013.01); *H01L 29/407* (2013.01); *H01L 29/41766* (2013.01); *H01L 29/41775* (2013.01); *H01L 29/66696* (2013.01); *H01L 29/7395* (2013.01); *H01L 29/7816* (2013.01)

(58) Field of Classification Search
CPC .. H01L 29/66712–29/66727; H01L 29/42368; H01L 29/7816; H01L 29/66333; H01L 29/6634; H01L 29/7395; H01L 29/66681–29/66696
See application file for complete search history.

(56) References Cited

U.S. PATENT DOCUMENTS

| | | | |
|---|---|---|---|
| 6,787,847 | B2 | 9/2004 | Disney |
| 8,216,925 | B2 | 7/2012 | Davies |
| 8,748,976 | B1* | 6/2014 | Kocon ................. H01L 29/404 |
| | | | 257/330 |
| 2003/0047768 | A1 | 3/2003 | Disney |
| 2005/0082591 | A1* | 4/2005 | Hirler ................. H01L 29/0619 |
| | | | 257/302 |
| 2008/0191273 | A1* | 8/2008 | Henson ................. H01L 29/407 |
| | | | 257/331 |
| 2009/0179273 | A1 | 7/2009 | Komachi |
| 2009/0206924 | A1* | 8/2009 | Zeng ................... H01L 29/0634 |
| | | | 327/581 |
| 2014/0030868 | A1* | 1/2014 | Parthasarathy ....... H01L 29/407 |
| | | | 438/430 |
| 2014/0045318 | A1* | 2/2014 | Parthasarathy ... H01L 21/31111 |
| | | | 438/430 |
| 2014/0339670 | A1* | 11/2014 | Henson ................. H01L 29/407 |
| | | | 257/488 |

FOREIGN PATENT DOCUMENTS

| | | |
|---|---|---|
| JP | H02-231771 A | 9/1990 |
| JP | 2007-529115 A | 10/2007 |
| JP | 2009-170598 A | 7/2009 |
| JP | 2011-129547 A | 6/2011 |
| JP | 2011-151408 A | 8/2011 |
| JP | 2011-233910 A | 11/2011 |
| WO | 2005/065385 A2 | 7/2005 |

OTHER PUBLICATIONS

An Office Action issued by the Japanese Patent Office dated Nov. 14, 2017, which corresponds to Japanese Patent Application No. 2014-255382 and is related to U.S. Appl. No. 14/879,564; with English Translation.

* cited by examiner

— FIRST COMPARATIVE EXAMPLE
······ FIFTH EMBODIMENT
— — — FIRST EMBODIMENT
—·—·— SECOND COMPARATIVE EXAMPLE

— FIRST COMPARATIVE EXAMPLE
······ FIFTH EMBODIMENT
— — — FIRST EMBODIMENT
—·—·— SECOND COMPARATIVE EXAMPLE
—··—··— SECOND COMPARATIVE EXAMPLE WITH SOURCE TRENCH

SEMICONDUCTOR DEVICE

BACKGROUND

Field of the Application

The present application relates to a semiconductor device.

Background Art

Conventionally, a vertical type insulated gate transistor provided with a field plate is known as disclosed in Japanese Patent Application Laid-Open No. 2011-151408. Inclusion of the field plate in the vertical insulated gate transistor allows a depletion layer to be expanded in a thickness direction of a drift layer. Even when a high concentration drift layer is provided, it is possible to obtain a high withstand voltage, and thereby make a reduction of on-resistance compatible with a high withstand voltage.

Expanding the depletion layer in the thickness direction of the drift layer can reduce a feedback capacitance and an output capacitance and improve a high frequency characteristic. The feedback capacitance is a capacitance between a gate and a drain (or collector) and is a capacitance component between a gate electrode and the drift layer. The output capacitance is a sum of a capacitance between the gate and the drain (or collector) and a capacitance between the drain and a source (or emitter). In the case of a MISFET, for example, the output capacitance is defined as the sum of a gate-drain capacitance and a drain-source capacitance. In the above-described prior art, a width of the field plate in the trench is constant and an electric field of the field plate uniformly extends to the drift layer. For this reason, inclusion of the field plate considerably promotes the depletion even in a region away from the gate electrode. As a result, attempting to promote the depletion in the vicinity of the gate electrode to reduce the feedback capacitance and output capacitance would increase on-resistance, resulting in a problem that a saturation current is lowered.

SUMMARY

The present invention has been implemented to solve the above-described problems and it is an object of the present invention to provide a semiconductor device improved so as to make suppression of a feedback capacitance and an output capacitance compatible with low on-resistance.

According to a first aspect of the present invention, a semiconductor device includes: a drift layer made of a first conductive type semiconductor; a first electrode provided on a back side of the drift layer and electrically connected to the drift layer; a first well region provided on a surface part of the drift layer and made of a semiconductor of a second conductive type opposite to the first conductive type; a second well region provided on a surface part of the first well region and made of a semiconductor of the first conductive type; a second electrode electrically connected to the second well region. The semiconductor device in the first aspect further includes: a gate electrode provided above the first and second well regions and the drift layer with a gate insulating film interposed between the gate electrode and the first and second well regions and the drift layer; and a field plate embedded in a first trench formed adjacent to the gate electrode on the surface part of the drift layer with an insulating film interposed between the field plate and the first trench and insulated from the gate electrode. In the first aspect, the first trench includes a base part and a side wall, the field plate is tapered toward the base part, and a distance between the side wall and a side face of the field plate is increased toward the base part side.

According to a second aspect, a semiconductor device includes: a drift layer made of a first conductive type semiconductor; a first electrode provided on a back side of the drift layer and electrically connected to the drift layer; a first well region provided on a surface part of the drift layer and made of a semiconductor of a second conductive type opposite to the first conductive type; a second well region provided on a surface part of the first well region and made of a semiconductor of the first conductive type; a second electrode electrically connected to the second well region. The semiconductor device in the second aspect further includes: a gate electrode provided above the first and second well regions and the drift layer with a first insulating film interposed between the gate electrode and the first and second well regions and the drift layer; and a field plate provided above the drift layer and adjacent to the gate electrode with a second insulating film interposed between the filed plate and the drift layer. In the second aspect, a thickness of the second insulating film increases as the distance from the gate electrode increases.

Other and further objects, features and advantages of the invention will appear more fully from the following description.

DETAILED DESCRIPTION OF THE PREFERRED EMBODIMENTS

Figure 1:
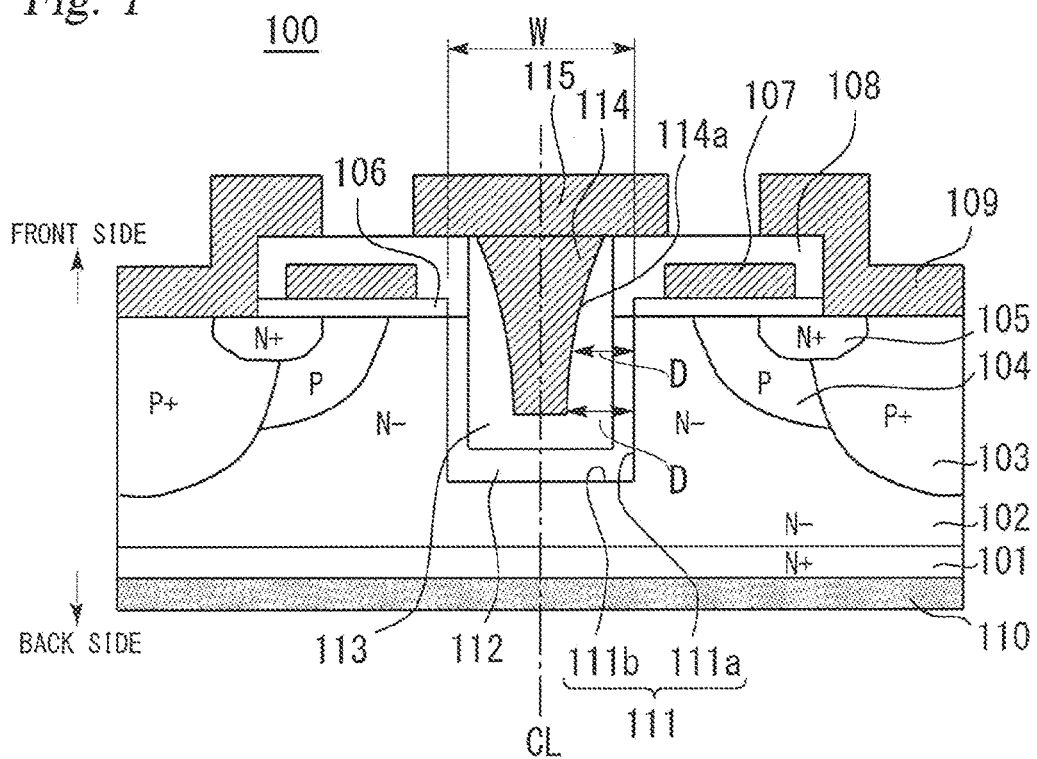
FIG. 1 is a cross-sectional view illustrating a semiconductor device according to a first embodiment of the present invention.

The present invention is applicable to a vertical insulated gate transistor. A semiconductor device according to first to third and fifth embodiments as specific examples thereof is a MIS field-effect transistor (MISFET), or more specifically a vertical MOSFET (VDMOSFET), and a semiconductor device according to a fourth embodiment is a vertical insulated gate bipolar transistor (IGBT). FIGS. 1 to 9 show cross-sectional views of the semiconductor devices according to the first to fifth embodiments, all of which are provided with a cross-sectional structure line-symmetric with respect to a virtual center line CL as a reference, in other words, provided with a cross-sectional structure laterally symmetric across a field plate of each embodiment. Since a structure symmetric with respect to the virtual center line CL as a reference on a plane of the sheet is provided, reference numerals are only assigned to one side of the symmetric structure provided as appropriate for simplicity in the drawings. Although the following embodiments will be described by defining the vertical direction, and front and back sides, these are defined for convenience to describe relative positional relationships among components. These have nothing to do with the vertical direction or horizontal direction, and the present invention is not interpreted exclusively. Moreover, the following embodiments will describe an N-channel type insulated gate type transistor, but the present invention is not limited to this. A P-channel type insulated gate type transistor can be obtained if a conductive type opposite to the respective conductive types of the illustrated diffusion region/doping regions is used, and the present invention provides equivalent effects in this case, too.

First Embodiment

[Configuration of Device of First Embodiment]

FIG. 1 is a cross-sectional view illustrating a semiconductor device 100 according to a first embodiment of the present invention. As shown in FIG. 1, the semiconductor device 100 is provided with an $N^+$-type semiconductor substrate 101 made of silicon, an $N^-$-type drift layer 102 which is an epitaxial layer provided on the surface side of the $N^+$-type semiconductor substrate 101, a $P^+$-type diffusion well region 103 provided on the surface of the $N^-$-type drift layer 102, a P-type channel well region 104 and an $N^+$-type diffusion well region 105. The P-type channel well region 104 is provided on the surface of the $N^-$-type drift layer 102. The $N^+$-type diffusion well region 105 is a source diffusion region in the vertical MOSFET and is partially provided on the surface of the P-type channel well region 104.

The semiconductor device 100 is further provided with a gate insulating film 106, a gate electrode 107 laminated on the gate insulating film 106, an inter-layer film 108 that covers a side face and a top surface of the gate electrode 107, a source electrode 109 formed on the surface of the $N^+$-type diffusion well region 105 so as to be electrically connected thereto, and a drain electrode 110 provided on a back side of the $N^-$-type drift layer 102 so as to be electrically connected to the $N^-$-type drift layer 102. The gate insulating film 106 is formed by thermally oxidizing the $N^-$-type drift layer 102 and extends over the $N^-$-type drift layer 102, the P-type channel well region 104 and the $N^+$-type diffusion well region 105. The gate electrode 107 is provided so as to overlap the $N^-$-type drift layer 102, the P-type channel well region 104 and the $N^+$-type diffusion well region 105 while sandwiching the gate insulating film 106. The gate electrode 107 is made of a conductive material such as polysilicon or high melting-point metal silicide. The inter-layer film 108 is intended to protect the gate electrode 107 and formed using a CVD method. The source electrode 109 is electrically connected to the $P^+$-type diffusion well region 103 and the $N^+$-type diffusion well region 105. The drain electrode 110 is electrically connected to the back of the $N^+$-type semiconductor substrate 101.

The semiconductor device 100 is further provided with a drain trench 111, a silicon oxide film 112 provided on an inner surface of the drain trench 111, an insulating film 113 superimposed on the silicon oxide film 112 to also function as a side wall, a field plate 114 provided in the drain trench 111 and a field plate electrode 115 formed on the field plate 114. The drain trench 111 is a trench formed adjacent to the gate electrode 107 in the surface part of the $N^-$-type drift layer 102. The drain trench 111 is formed between the two gate electrodes 107. The silicon oxide film 112 is formed on the side wall and base part of the drain trench 111 using a method such as thermal oxidation. The silicon oxide film 112 is provided to insulate the field plate 114 and an insulating layer may also be formed in the drain trench 111 using another insulating material as a substitute of the silicon oxide film 112.

The insulating film 113 that functions as a side wall is formed by forming a silicon oxide film in the drain trench 111 using a CVD method or the like and etching the film using a dry etching method or the like. The insulating film 113 provided on the side wall 111a side of the drain trench 111 is etched such that the thickness thereof decreases toward the gate electrode 107 side and increases toward the base part 111b side of the drain trench 111.

In this way, a taper shaped hole is made in the insulating film 113, the diameter of the hole decreasing toward the distal end in a curve as shown in FIG. 1. As an example, in the semiconductor device 100, the insulating film 113 is provided not only on the side wall 111a side but also on the base part 111b side. However, the present invention is not limited to this, but the insulating film 113 may not be provided on the base part 111b side and the silicon oxide film 112 on the base part 111b may be exposed from the hole formed by etching.

The field plate 114 is a conductor made of a conductive material on the insulating film 113 and is formed of polysilicon or high melting-point metal such as tungsten. The field plate 114 is embedded in the drain trench 111 with the silicon oxide film (SiO2 film) 112 and insulating film 113 interposed therebetween. The field plate 114 is insulated from the gate electrode 107 by the inter-layer film 108. The field plate electrode 115 is electrically connected to the field plate 114 and connected to the source electrode 109. Note that the field plate electrode 115 needs not directly be connected to the source electrode 109 but may be connected to another electrode which has the same potential (more specifically, grounded) as that of the source electrode 109.

The field plate 114 is tapered toward the base part 111b of the drain trench 111. A distance D between the side wall 111a of the drain trench 111 and the side face 114a of the field plate 114 increases toward the base part 111b side. In the present embodiment in particular, the side face 114a is a curved surface and is smoothly caved in toward the center side of the field plate 114.

[Operation of Device of First Embodiment]

First Comparative Example

Figure 2:
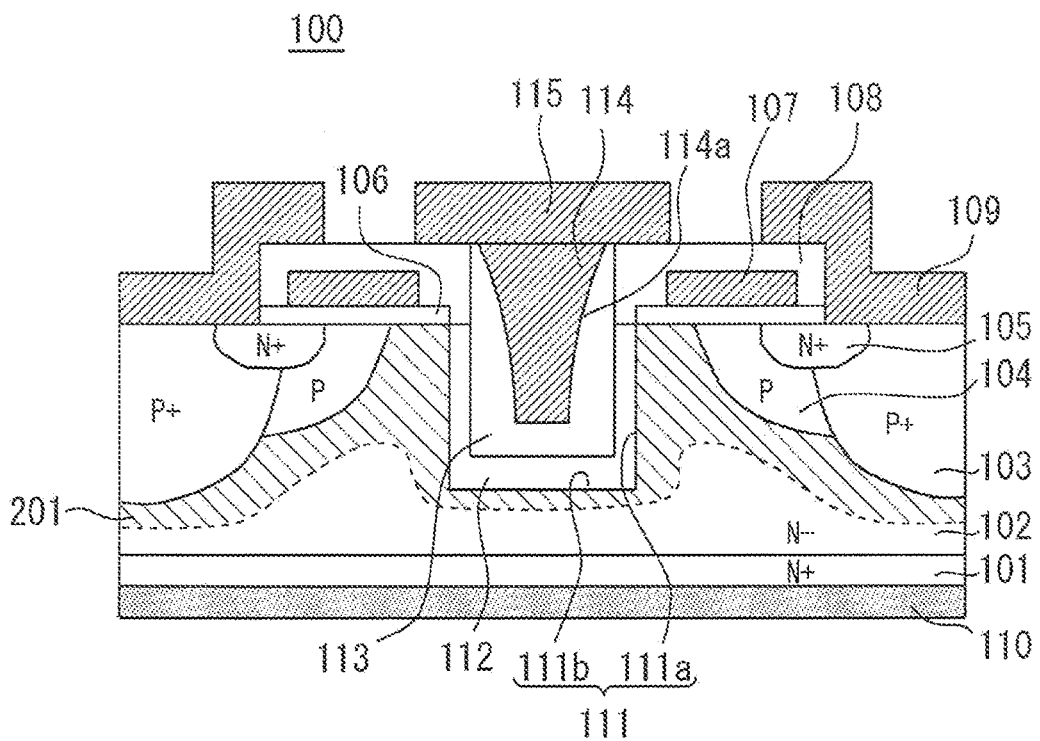
FIG. 2 is a cross-sectional view schematically illustrating a depletion layer formed in the semiconductor device according to the first embodiment of the present invention.
Figure 13:
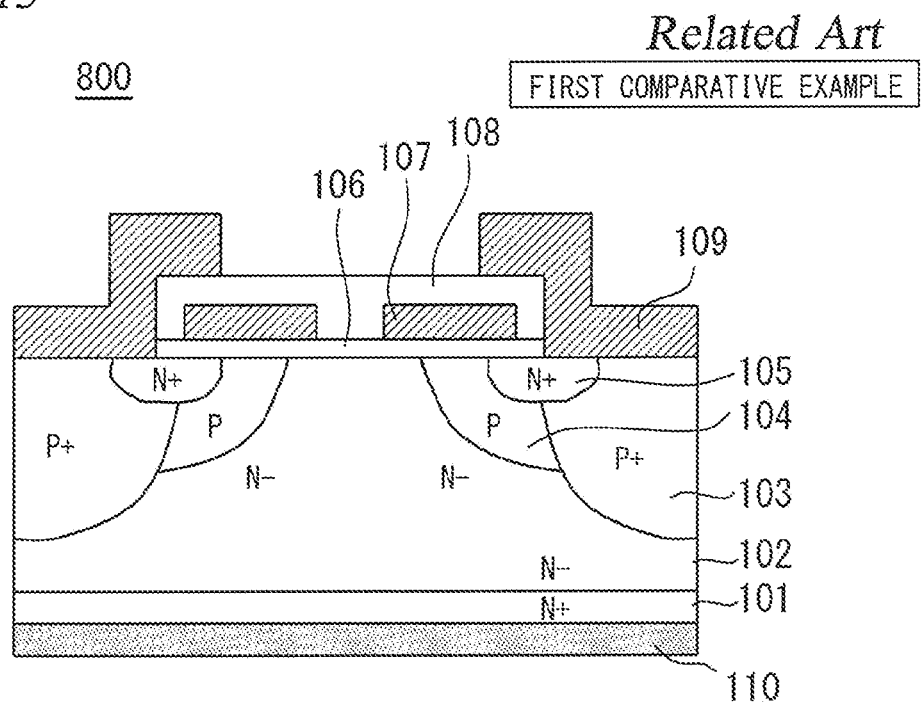
FIG. 13 is a cross-sectional view illustrating a semiconductor device according to a first comparative example of the present embodiment.
Figure 14:
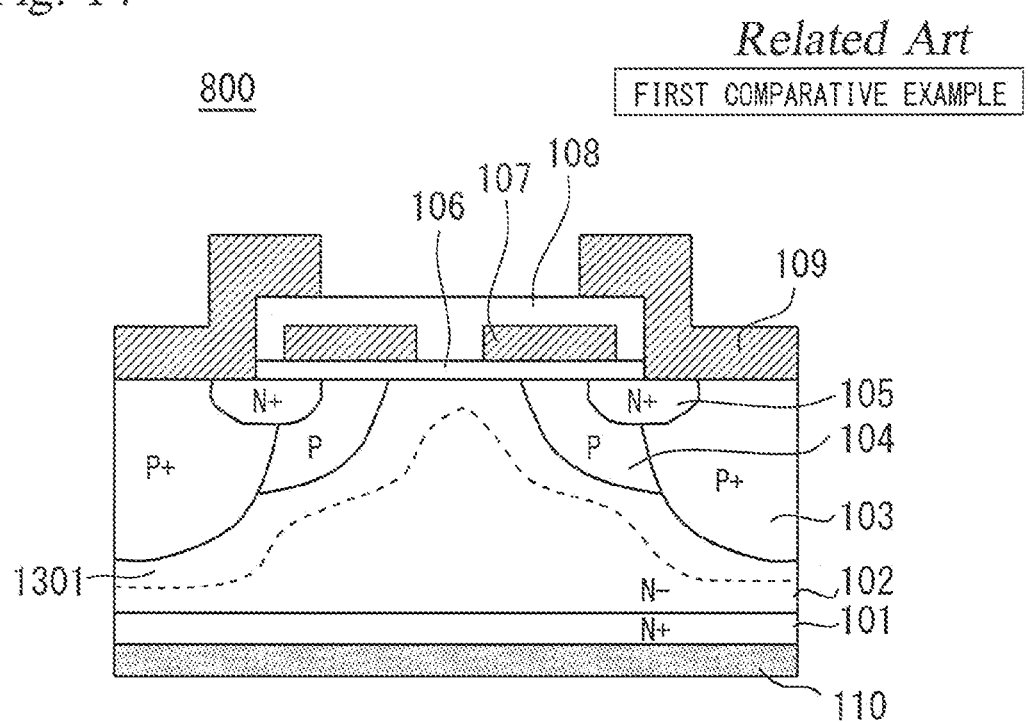
FIG. 14 is a cross-sectional view schematically illustrating a depletion layer formed in the semiconductor device according to the first comparative example of the first embodiment.

FIG. 13 is a cross-sectional view illustrating a semiconductor device 800 according to a first comparative example of the present embodiment. The semiconductor device 800 shown in FIG. 13 is a vertical MOSFET as a first comparative example. The semiconductor device 800 has a configuration similar to that of the semiconductor device 100 except that it has no structure of the drain trench 111 and its periphery. FIG. 14 is a cross-sectional view schematically illustrating a depletion layer 1301 formed in the semiconductor device 800 according to the first comparative example of the first embodiment. In FIG. 13 and FIG. 14, components identical or corresponding to those in FIG. 1 and FIG. 2 are assigned identical reference numerals and description thereof will be omitted or simplified.

The depletion layer 1301 is formed in the N$^-$-type drift layer 102 when a positive voltage is applied to the drain electrode 110 of the semiconductor device 800 and the source electrode 109 is grounded. The depletion layer 1301 is also formed immediately below and in the vicinity of the gate electrode 107. When the depletion layer 1301 is formed in this way, a feedback capacitance Cgd and an output capacitance Coss become greater than those of a horizontal MOSFET (LDMOSFET), and the semiconductor device 800 is therefore disadvantageous in a high frequency operation. The feedback capacitance Cgd is a gate-drain capacitance and is a capacitance component between the gate electrode 107 and the N$^-$-type drift layer 102. The output capacitance Coss is defined as the sum of the gate-drain capacitance and the drain-source capacitance.

Second Comparative Example

Figure 15:
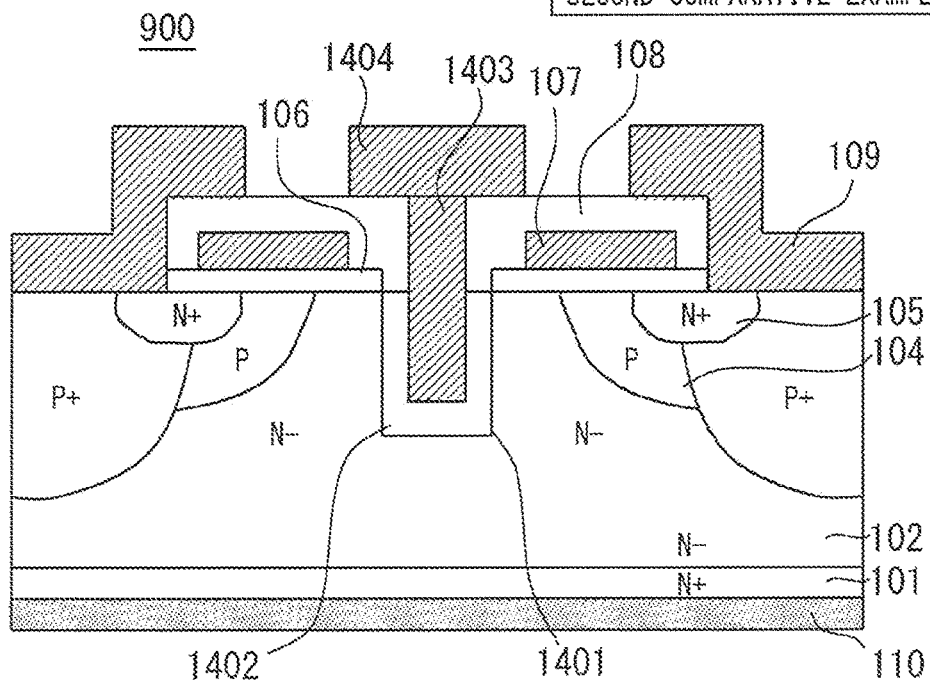
FIG. 15 is a cross-sectional view illustrating a semiconductor device according to a second comparative example of the present embodiment.
Figure 16:
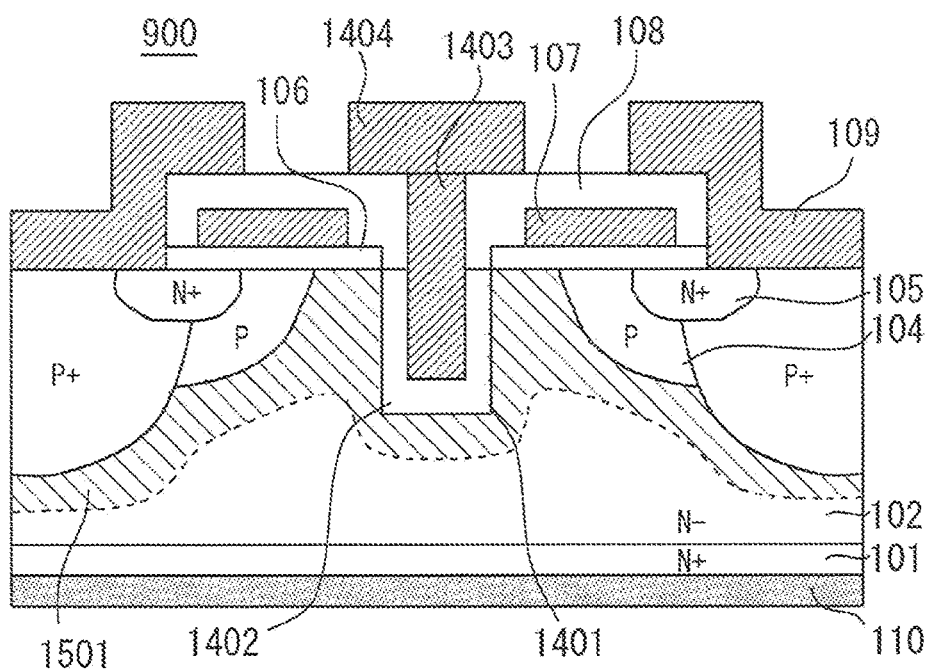
FIG. 16 is a cross-sectional view schematically illustrating a depletion layer formed in the semiconductor device according to the second comparative example of the present embodiment.

FIG. 15 is a cross-sectional view illustrating a semiconductor device 900 according to a second comparative example of the present embodiment. The semiconductor device 900 shown in FIG. 15 is provided with a structure improved to enhance a high frequency operation. The semiconductor device 900 is common to the semiconductor device 100 according to the first embodiment in that it includes a drain trench 1401 and a silicon oxide film 1402 and a field plate 1403 provided therein. However, it is different from the semiconductor device 100 according to the first embodiment in that the thickness of the field plate 1403 is constant. FIG. 16 is a cross-sectional view schematically illustrating a depletion layer 1501 formed in the semiconductor device 900 according to the second comparative example of the present embodiment. In FIG. 15 and FIG. 16, components identical or corresponding to those in FIG. 1 are assigned identical reference numerals and description thereof will be omitted or simplified.

The drain trench 1401 is formed in the N$^-$-type drift layer 102 between the gate electrodes 107. The silicon oxide film 1402 is formed on the side wall of the drain trench 1401 using a method such as thermal oxidation. The field plate 1403 is formed on, for example, the silicon oxide film 1402 using polysilicon or a high melting-point metal. The field plate electrode 1404 is electrically connected to the field plate 1403 and connected to the source electrode 109.

The depletion layer 1501 in FIG. 16 is a depletion layer formed in the N$^-$-type drift layer 102 when a positive voltage is applied to the drain electrode 110 in the semiconductor device 900 of the second comparative example and the source electrode 109 is grounded. The magnitude of the gate-drain capacitance is inversely proportional to the size of the depletion layer between the gate and drain in the depth direction, that is, the size of the N$^-$-type drift layer 102 in the thickness direction in FIG. 16. Since the field plate 1403 promotes the depletion of the N$^-$-type drift layer 102, the depletion layer 1501 expands to a deep part of the N$^-$-type drift layer 102. For this reason, it is possible to reduce the gate-drain capacitance and reduce the feedback capacitance Cgd and the output capacitance Coss more than in the first comparative example.

However, since the thickness of the field plate 1403 in the second comparative example is constant, the depletion is strongly promoted also in the deep part of the N$^-$-type drift layer 102. The depletion in the deep part of the N$^-$-type drift layer 102 increases the resistance of the drain current path, leading to an increase in on-resistance Ron.

(Operation and Effects of First Embodiment)

FIG. 2 is a cross-sectional view schematically illustrating a depletion layer formed in the semiconductor device 100 according to the first embodiment of the present invention. A depletion layer 201 is formed in the N$^-$-type drift layer 102 when a positive voltage is applied to the drain electrode 110 of the semiconductor device 100 and the source electrode 109 is grounded. In the first embodiment, the field plate 114 is tapered toward the base part 111b of the drain trench 111 and the distance D between the side wall 111a of the drain trench 111 and the side face 114a of the field plate 114 increases toward the base part 111b side. Therefore, the distance D which is an interval between the field plate 114 and the N$^-$-type drift layer 102 can be adjusted to be greater in the vicinity of the gate electrode 107 and smaller at a place away from the gate electrode 107. This allows the electric field by the field plate 114 to act strongly in the vicinity of the gate electrode 107 and act weakly at a place away from the gate electrode 107. Since the electric field by the field plate 114 weakens toward the base part 111b side of the drain trench 111, it is possible to weaken the action of expanding the depletion layer 201 on the base part 111b side of the drain trench 111. The field plate 114 can weaken the depletion action in the deep part of the N$^-$-type drift layer 102 while expanding the depletion layer 201 downward of the gate electrode 107, reduce the on-resistance Ron and thereby reduce the electric resistance of the drain current path. This allows suppression of the feedback capacitance Cgd and the output capacitance Coss to be compatible with suppression of on-resistance Ron.

Figure 10:
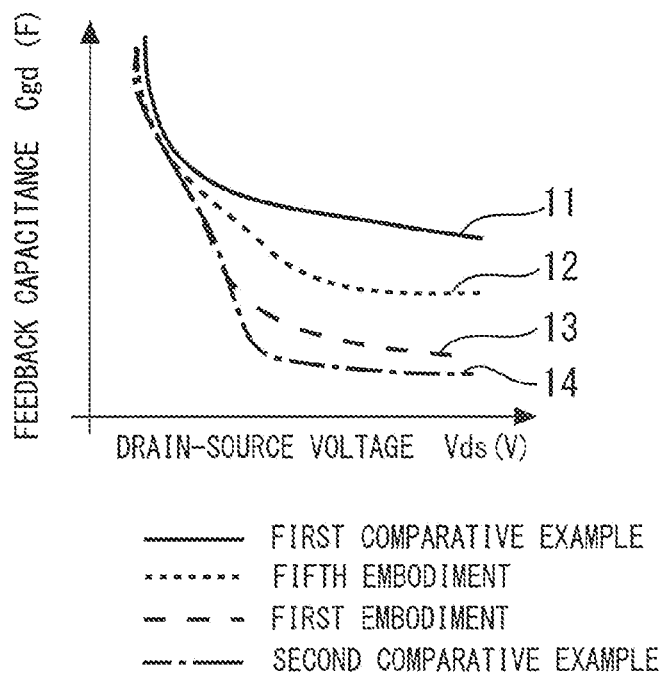
FIG. 10 is a diagram provided for describing effects of the semiconductor device according to the first to second embodiments and the fifth embodiment of the present invention.
Figure 11:
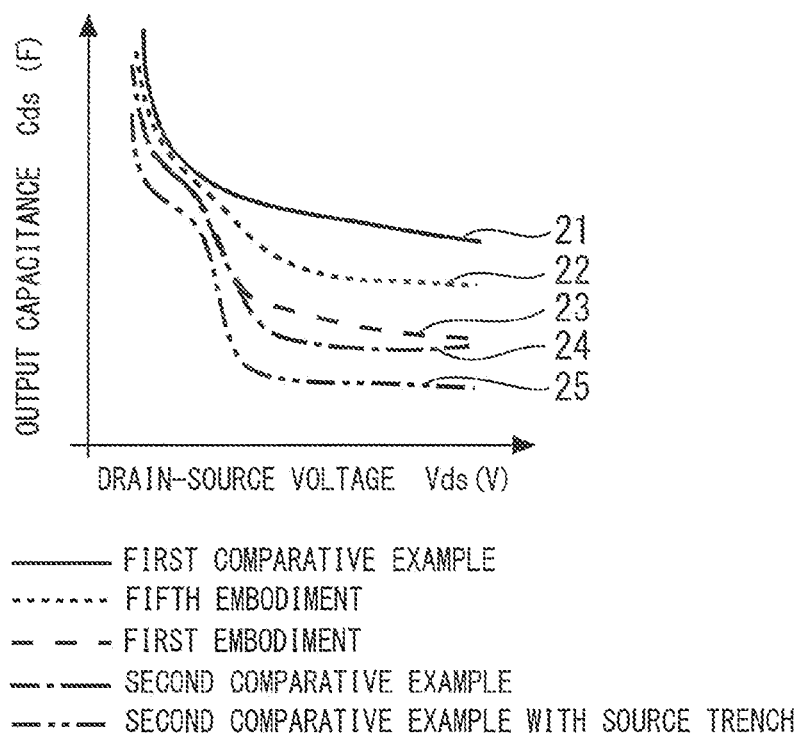
FIG. 11 is a diagram provided for describing effects of the semiconductor device according to the first to second embodiments and the fifth embodiment of the present invention.
Figure 12:
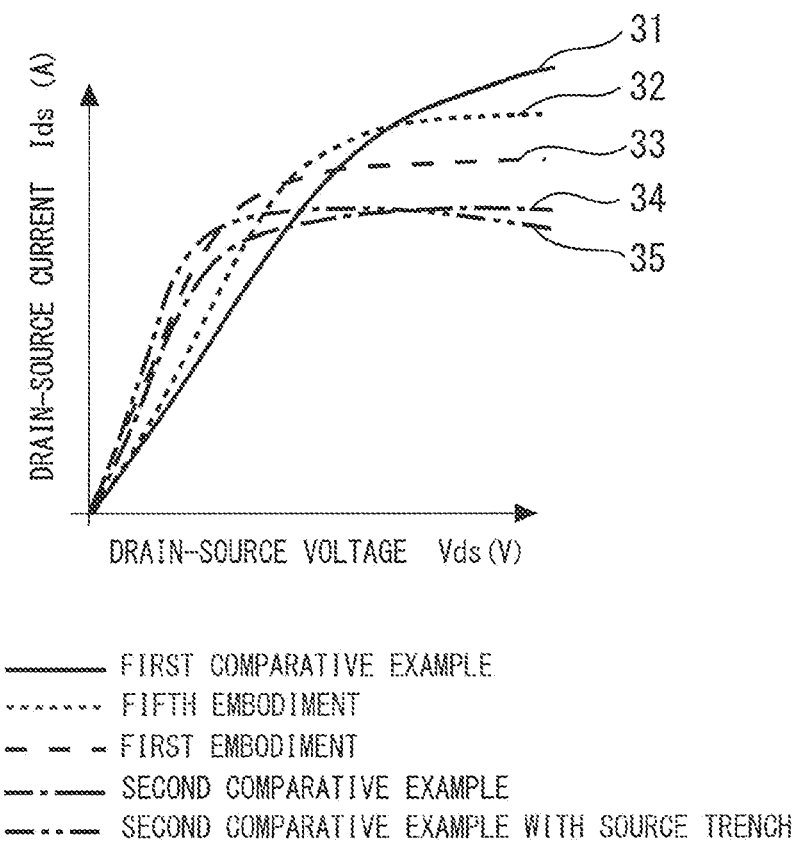
FIG. 12 is a diagram provided for describing effects of the semiconductor device according to the first to second embodiments and the fifth embodiment of the present invention.

FIGS. 10 to 12 are diagrams provided for describing effects of the semiconductor device 100 according to the first embodiment of the present invention, and are graphs showing characteristic curves indicating various electrical characteristics. FIGS. 10 to 12 also include data for describing effects of semiconductor devices according to second, third and fifth embodiments which will be described later.

FIG. 10 is a diagram illustrating a drain-source voltage Vds dependency of a gate-drain feedback capacitance Cgd. A characteristic curve 11 shows data of the semiconductor device 800 according to the first comparative example. A characteristic curve 13 shows data of the semiconductor device 100 according to the first embodiment. A characteristic curve 14 shows data of the semiconductor device 900 according to the second comparative example. A characteristic curve 12 shows data of a semiconductor device 700 according to a fifth embodiment which will be described later.

FIG. 11 is a diagram illustrating a drain-source voltage Vds dependency of a drain-source output capacitance Coss. A characteristic curve 21 shows data of the semiconductor device 800 according to the first comparative example. A characteristic curve 23 shows data of the semiconductor device 100 according to the first embodiment. A characteristic curve 24 shows data of the semiconductor device 900 according to the second comparative example. A characteristic curve 22 shows data of the semiconductor device 700 according to the fifth embodiment which will be described later and a characteristic curve 25 shows data when a source trench electrode 304 according to the second embodiment which will be described later is provided in the semiconductor device 900 according to the second comparative example.

As shown in FIG. 2, FIG. 14 and FIG. 16, the depletion layers 201, 1301 and 1501 are formed by PN junction mutually formed by the P$^+$-type diffusion well region 103, P-type channel well region 104 and N$^-$-type drift layer 102 respectively. With the characteristic curves 11 and 21 according to the first comparative example, the depletion layer 1301 expands according to an increase of the drain-source voltage Vds, and the feedback capacitance Cgd and the output capacitance Coss thereby decrease. With the characteristic curves 14 and 24 according to the second comparative example, the depletion of the N$^-$-type drift layer 102 is promoted by the source (ground) connected field plate 1403 and the feedback capacitance Cgd and output capacitance Coss drastically decrease. On the other hand, since in the first embodiment, the promoting of depletion is reduced more than in the second comparative example, the characteristic curves 13 and 23 according to the first embodiment obtain characteristics intermediate between the characteristic curves 11 and 21, and the characteristic curves 14 and 24.

FIG. 12 shows a drain-source voltage Vds dependency of the drain-source current Ids when a gate voltage at which a channel inversion layer becomes a maximum is applied assuming a vertical MOSFET that has an identical drain-source breakdown voltage. A characteristic curve 31 shows data of the semiconductor device 800 according to the first comparative example. A characteristic curve 33 shows data of the semiconductor device 100 according to the first embodiment. A characteristic curve 34 shows data of the semiconductor device 900 according to the second comparative example. A characteristic curve 32 shows data of the semiconductor device 700 according to the fifth embodiment which will be described later, and a characteristic curve 35 shows data when the source trench electrode 304 according to the second embodiment which will be described later is provided in the semiconductor device 900 according to the second comparative example.

In the first comparative example, since the cross-sectional shape of the depletion layer 1301 immediately below the gate electrode 107 has a small radius of curvature as shown in FIG. 14, the N$^-$-type drift layer 102 needs to be a layer with high specific resistance. This results in an increase of on-resistance. On the other hand, in the second comparative example, it is possible to design the N$^-$-type drift layer 102 with lower specific resistance than in the first comparative example due to the depletion of the N$^-$-type drift layer 102 by the field plate 1403 and it is possible to reduce on-resistance. However, since the depletion of the N$^-$-type drift layer 102 is promoted on the side wall side of the drain trench 1401, the drain-source current Ids is more likely to saturate. This appears as a difference between the characteristic curves 31 and 34 in FIG. 12.

In the first embodiment, since the electric field by the field plate 114 is made to gradually weaken toward the base part 111b side, it is possible to make gentler the reduction rates of the feedback capacitance Cgd and the output capacitance Coss than in the second comparative example. This can be understood from a comparison between the characteristic curves 13 and 23 of the first embodiment and the characteristic curves 14 and 24 of the second comparative example in FIG. 10 and FIG. 11. Since it is possible to suppress depletion in the deep part of the N$^-$-type drift layer 102, on-resistance can be reduced and the current value at which the drain-source current Ids saturates can also be increased.

It is preferable to reduce the feedback capacitance Cgd and the output capacitance Coss for an operation in a high frequency band and preferable to lower on-resistance and increase a drain saturation current to achieve high power amplification. According to the first embodiment, it is possible to make a reduction of the feedback capacitance Cgd and the output capacitance Coss when a high drain voltage is applied compatible with a reduction of on-resistance when a low drain voltage is applied. As a result, the semiconductor device 100 according to the first embodiment displays superiority when performing high power amplification in a high frequency band.

In the first embodiment, the side face 114a of the field plate 114 is a curved surface and the field plate 114 is smoothly caved in toward the center side of itself in a cross-sectional view, as shown in FIG. 1. Thus, it is possible to increase the distance D which is an interval between the field plate 114 and the N$^-$-type drift layer 102 continuously and like a quadratic function toward the base part 111b side. As a result, it is possible to weaken the electric field by the field plate 114 abruptly in the deep part of the N$^-$-type drift layer 102.

The field plate 114 is preferably tapered continuously toward the base part 111b side of the drain trench 111. This is because when the silicon oxide film 112 is formed into a step-wise shape so that the field plate has a step-wise tapered stepped section, the electric field strength peripheral to the field plate varies discontinuously when a drain voltage is applied. Such discontinuity of the electric field strength causes a reduction of a breakdown voltage and a reduction of the carrier speed. To avoid this, it is preferable to continuously change the shape of the silicon oxide film 112 and thereby continuously taper the field plate 114. As one of such preferred embodiments, in the first embodiment, the side face 114a of the field plate 114 is a curved surface. However, without being limited to the curved surface, the field plate 114 may be linearly tapered. In this case, the side face 114a has a flat slanting surface. From the standpoint of manufacturing steps, working the field plate 114 into a curved surface shape or tapered shape is more realistic and is preferable in terms of ease of manufacturing as well. In the first embodiment, the side face 114a is a concave curved surface which is caved in toward the center side of the field plate 114. However, the present invention is not limited to this, and the side face 114a may have a convex curved surface which juts out to the outside of the field plate 114. Moreover, a curved surface may be combined with a flat slanting surface to form the side face 114a. In any case, by adopting a tapered shape, it is possible to adjust the change rate of the electric field strength by the field plate 114 in various forms. Note that although it is preferable to adopt a continuously tapered shape for the above-described reason, the present invention is not limited to this, but the field plate 114 may have a step-wise tapered shape with 2, 3, 4 or more steps.

As shown in FIG. 1, a diameter W of the drain trench 111 is preferably constant along the depth direction. This gives advantages like the trench forming step becoming simple. However, the present invention is not limited to this, and the diameter of the drain trench 111 need not be constant and may be tapered toward the base part 111b or inversely tapered. When such modifications are added, by making the tapered shape of the field plate 114 more acute than the taper of the drain trench 111, the distance D between the side wall 111a and the side face 114a may be increased toward the base part 111b side.

In the semiconductor device 100, since the silicon oxide film 112 is formed in the lower layer of the insulating film 113, it is possible to reduce an interface state of the side wall 111a of the drain trench 111. Thus, when the semiconductor device 100 is caused to operate continuously, it is possible to prevent characteristic deterioration by hot carriers.

Forming the deep drain trench 111 causes a breakdown voltage between the gate electrode 107 and the N$^-$-type drift layer 102 to increase, and at the same time, the on-resistance also increases. Because of such a relationship, causing the breakdown voltage to increase more than necessary may lead to a reduction of high frequency operation, and it is therefore preferable to limit the drain trench 111 to an appropriate depth. It is normally preferable to set "a breakdown voltage of PN junction between the P$^+$-type diffusion well region 103 and the N$^-$-type drift layer 102" (hereinafter referred to as first breakdown voltage) in a vertical MOSFET to 4 to 6 times a supply voltage. It is also preferable to set "a breakdown voltage between the gate electrode 107 and N$^-$-type drift layer 102" (hereinafter referred to as second breakdown voltage) to a higher level than this first breakdown voltage. Therefore, the depth of the drain trench 111 is preferably determined to a depth of such a degree that the above-described first breakdown voltage becomes 4 to 6 times the supply voltage and the second breakdown voltage becomes higher than the first breakdown voltage.

Second Embodiment

Figure 3:
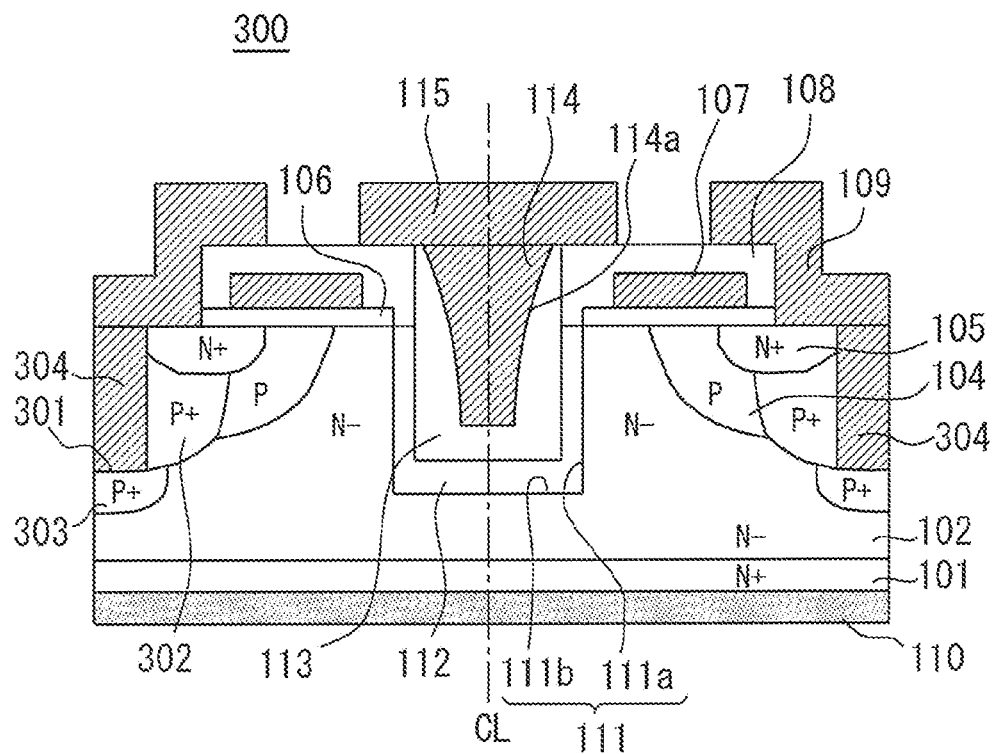
FIG. 3 is a cross-sectional view illustrating a semiconductor device according to a second embodiment of the present invention.
Figure 4:
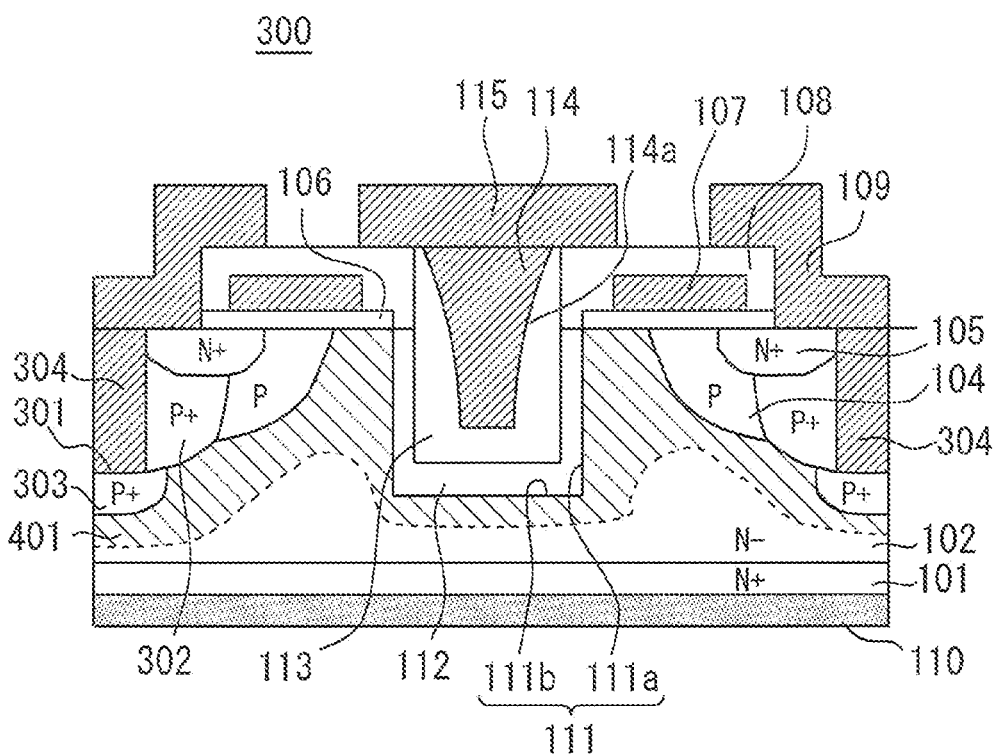
FIG. 4 is a cross-sectional view schematically illustrating a depletion layer formed in the semiconductor device according to the second embodiment of the present invention.

FIG. 3 is a cross-sectional view illustrating a semiconductor device 300 according to a second embodiment of the present invention. FIG. 4 is a cross-sectional view schematically illustrating a depletion layer 401 formed in the semiconductor device 300. In FIG. 3 and FIG. 4, components identical or corresponding to those in FIG. 1 and FIG. 2 are assigned identical reference numerals and description thereof will be omitted or simplified.

The semiconductor device 300 according to the second embodiment is provided with a source trench 301, P$^+$-type well regions 302 and 303, and a source trench electrode 304. The first embodiment and the second embodiment are different in this respect. The source trench 301 is a trench opened adjacent to the N$^+$-type diffusion well region 105. The P$^+$-type well region 302 can be formed by implanting an impurity into a side wall of the source trench 301 after forming the source trench 301. The P$^+$-type well region 302 may be preferably formed by implanting P-type ions at an angle of incidence of 10 to 45 degrees into the side wall of the source trench 301. The P$^+$-type well region 303 can also be formed by implanting an impurity into the base part of the source trench 301 after forming the source trench 301. The P$^+$-type well region 303 may be preferably formed by implanting P-type ions into the base part of the source trench 301 at an angle of incidence of 0 to 7 degrees. The source trench electrode 304 is obtained by embedding a conductive material, for example, polysilicon or a high melting-point metal into the source trench 301 and is electrically connected to the source electrode 109. A depletion layer 401 shown in FIG. 4 is formed in the N$^-$-type drift layer 102 when a positive voltage is applied to the drain electrode 110 and the source electrode 109 is grounded.

If the P$^+$-type diffusion well region 103 is formed through thermal diffusion, P-type impurity concentration decreases at a deep position of the P$^+$-type diffusion well region 103. In order to form the P$^+$-type diffusion well region 103 up to the deep position of the N$^-$-type drift layer 102 through thermal diffusion, a large diffusion width in the horizontal direction needs to be secured according to the diffusion depth. On the other hand, in the second embodiment, the high concentration P$^+$-type well region 302 is formed directly in the base part of the source trench 301 opened up to the deep part of the N$^-$-type drift layer 102. Furthermore, in the second embodiment, the P$^+$-type well region 302 is formed through not thermal diffusion but ion implantation and the high concentration P$^+$-type well region 302 can be formed to a necessary depth with high accuracy.

It is possible to promote the expansion of the depletion layer 401 in the horizontal direction by the high concentration P$^+$-type well region 302 formed in the deep position of the N$^-$-type drift layer 102. Since a thick depletion layer can be easily formed in the N$^-$-type drift layer 102 immediately below the channel even at a low drain voltage, it is possible to provide the high concentration N$^-$-type drift layer 102 in the second embodiment. Note that since the electric field between the high concentration P$^+$-type well region 303 and the N$^-$-type drift layer 102 is high, breakdown due to application of a drain-source voltage occurs at an end of the P$^+$-type well region 303.

The characteristic curve 25 in FIG. 11 and the characteristic curve 35 in FIG. 12 are data when the source trench electrode 304 is added to the semiconductor device 900 of the second comparative example. Inclusion of the source trench electrode 304, P$^+$-type well region 302 and P$^+$-type well region 303 allows the N$^-$-type drift layer 102 immediately below the channel to become thick and depleted even when the drain-source voltage Vds is low. As a result, as shown in the characteristic curve 25 in FIG. 11, the output capacitance Coss drastically decreases at the low drain-source voltage Vds. This enables further improvement of high frequency characteristics compared to the first embodiment.

The depths of the drain trench 111 and source trench 301 can be designed according to the following criteria.

(1) The deeper the source trench 301 is formed from the surface part of the N$^-$-type drift layer 102, the lower the breakdown voltage (corresponding to the first breakdown voltage as described in the first embodiment) of the PN junction between the P$^+$-type well region 303 and the N$^-$-type drift layer 102 becomes. The deeper the drain trench 111 is formed from the surface part of the N$^-$-type drift layer 102, the higher the breakdown voltage (that is, the second breakdown voltage as described in the first embodiment) between the gate electrode 107 and the N⁻-type drift layer 102 becomes.

(2) The breakdown voltage of the PN junction between the P⁺-type well region 303 and the N⁻-type drift layer 102 (the first breakdown voltage described in the first embodiment) is preferably set to 4 to 6 times the supply voltage. By deepening the drain trench 111, the drain-source breakdown voltage increases but the on-resistance also increases, and therefore the high frequency characteristic deteriorates. For this reason, it is preferable to set the depth of the drain trench 111 to an extent that the first breakdown voltage within a range of 4 to 6 times the supply voltage can be obtained.

(3) The "breakdown voltage between the gate electrode 107 and the N⁻-type drift layer 102 (the second breakdown voltage described in the first embodiment)" is preferably set to be higher than the above-described first breakdown voltage. Since the deeper the source trench 301, the lower the first breakdown voltage becomes, it is preferable to make the source trench 301 deeper than the drain trench 111 in order to make second breakdown voltage>first breakdown voltage, as is demonstrated in FIGS. 5 and 6 (discussed below). This allows the drain-source breakdown current to flow into the source trench electrode 304 with low resistance, and it is thereby possible to prevent a surge current or breakdown of the gate insulating film caused by reflection power during a load fluctuation or the like.

The semiconductor device 300 according to the second embodiment can further promote the expansion of the depletion layer 401 when a drain-source voltage is applied as compared to the first embodiment. For this reason, the semiconductor device 300 can set the N⁻-type drift layer 102 to higher concentration than in the first embodiment. Therefore, it is possible to further reduce the on-resistance Ron and achieve a high output.

The semiconductor device 300 according to the second embodiment has superiority also from the standpoint of a manufacturing technique. The P⁺-type diffusion well region 103 in the first and second comparative examples and the first embodiment is a well region into which an impurity is implanted from the surface part of the N⁻-type drift layer 102. To set an operating voltage and a breakdown voltage, it is necessary to optimize the electric field strength and the depletion layer shape in the N⁻-type drift layer 102 by changing the depth of the P⁺-type diffusion well region 103. A basic structure needs to be designed also for each application such as designing a mask pattern layout by taking into account the expansion of the P⁺-type diffusion well region 103 in the horizontal direction. In contrast, in the second embodiment, it is possible to control the width of the depletion layer 401 in the thickness direction of the N⁻-type drift layer 102 relatively easily by providing the P⁺-type well region 303 while changing the respective depths of the source trench 301 and the drain trench 111. It is possible to supply, from a common basic structure, different products of vertical MOSFETs having different operating voltages and different breakdown voltages relatively easily by adjusting the depths of the source trench 301 and the drain trench 111 for the common basic structure.

Third Embodiment

Figure 5:
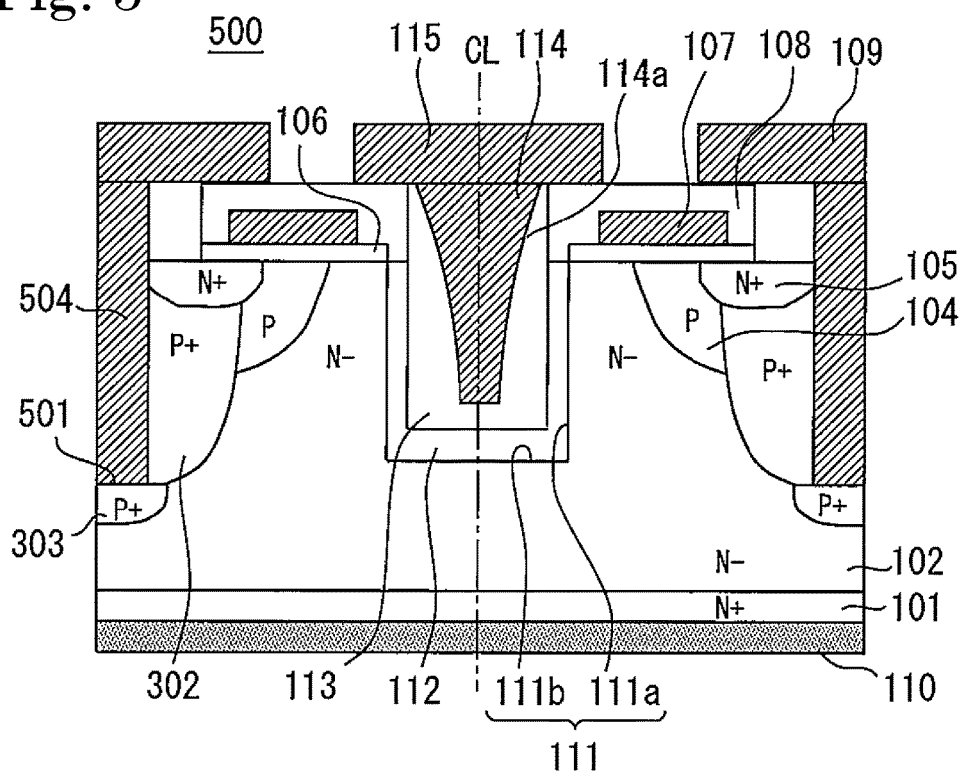
FIG. 5 is a cross-sectional view illustrating a semiconductor device according to a third embodiment of the present invention.
Figure 6:
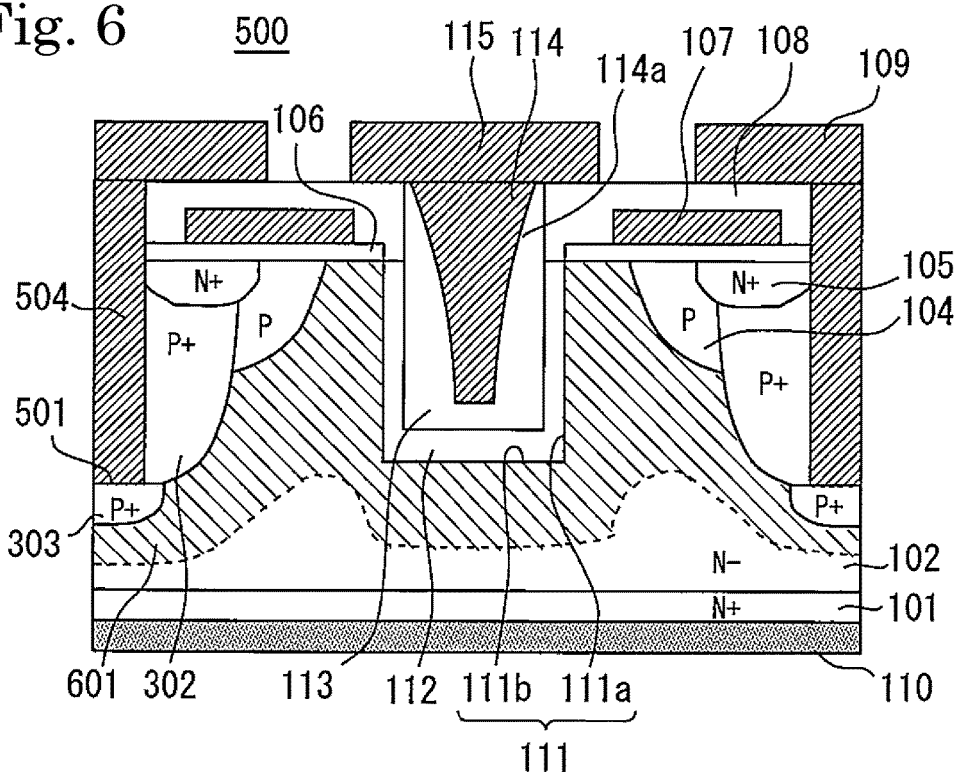
FIG. 6 is a cross-sectional view schematically illustrating a depletion layer formed in the semiconductor device to the third embodiment of the present invention.

FIG. 5 is a cross-sectional view illustrating a semiconductor device 500 according to a third embodiment of the present invention. FIG. 6 is a cross-sectional view schematically illustrating a depletion layer 601 formed in the semiconductor device 500. In FIG. 5 and FIG. 6, components identical or corresponding to those in FIG. 1 to FIG. 4 are assigned identical reference numerals and description thereof will be omitted or simplified.

A source trench 501 is a trench opened adjacent to the N⁺-type diffusion well region 105. The source trench 501 is provided closer to the gate electrode 107 than the source trench 301 of the second embodiment. By implanting an impurity into a side wall and a base part of the source trench 501, the P⁺-type well regions 302 and 303 are formed in the same way as in the second embodiment. As shown in FIG. 5, the source trench 501 is formed from a position adjacent to the inter-layer film 108 while contacting the N⁺-type diffusion well region 105 immediately below the inter-layer film 108 and reaches the P⁺-type well region 303. A top end of the source trench electrode 504 is connected to the source electrode 109 and a side face of the source trench electrode 504 is connected to the N⁺-type diffusion well region 105.

A depletion layer 601 shown in FIG. 6 is formed in the N⁻-type drift layer 102 when a positive voltage is applied to the drain electrode 110 and the source electrode 109 is grounded.

In the semiconductor devices 100 and 300 according to the first and second embodiments, the surface part of the N⁺-type diffusion well region 105 is directly connected to the source electrode 109. In contrast, in the third embodiment, the N⁺-type diffusion well region 105 and the source electrode 109 are electrically connected via the source trench electrode 504.

Since the semiconductor device 500 according to the third embodiment and the semiconductor device 300 according to the second embodiment are provided with the source trench 301, 501, electrical characteristics similar to those of the second embodiment (characteristic curves 25 and 35 in FIG. 11 and FIG. 12) are obtained in the third embodiment.

According to the second embodiment, in order to connect the surface part of the N⁺-type diffusion well region 105 with the source electrode 109, the surface part of the N⁺-type diffusion well region 105 expands from an end of the gate insulating film 106 in a width direction (rightward direction on the plane of the sheet) of the semiconductor device 500. In contrast, in the third embodiment, the N⁺-type diffusion well region 105 and the source electrode 109 are electrically connected via the source trench electrode 504. For this reason, in the third embodiment, the N⁺-type diffusion well region 105 is terminated at an end of the gate insulating film 106 and the source trench 501 is brought closer to the gate electrode 107 side. Therefore, according to the third embodiment, it is possible to further shorten the horizontal width of the basic structure of the vertical MOSFET compared to the second embodiment and provide a small-sized semiconductor device 500.

Fourth Embodiment

Figure 7:
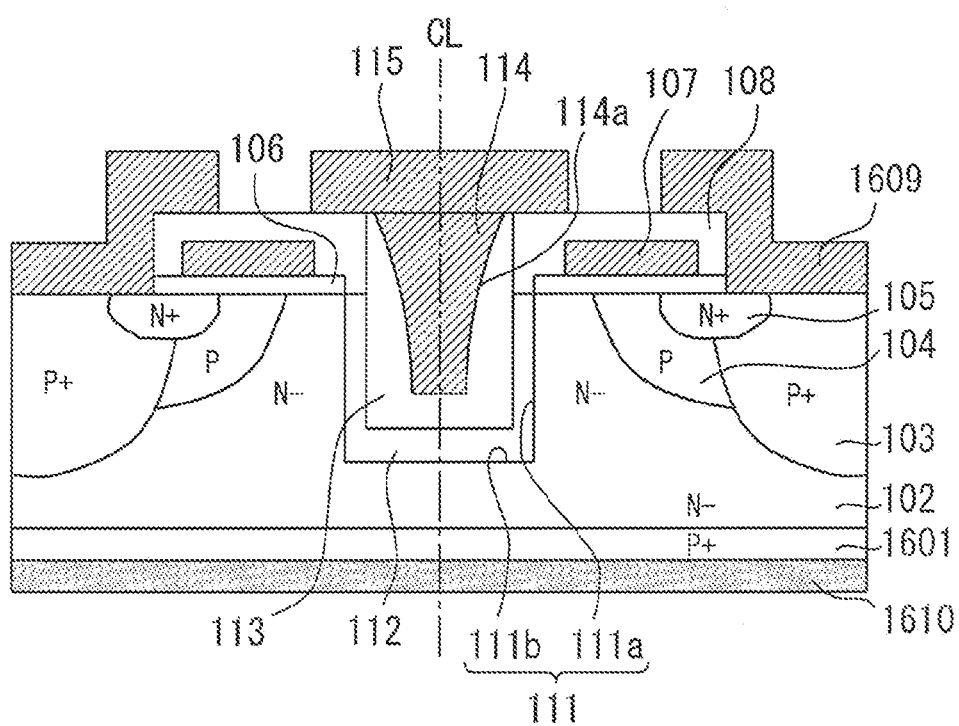
FIG. 7 is a cross-sectional view illustrating a semiconductor device according to a fourth embodiment of the present invention.

FIG. 7 is a cross-sectional view illustrating a semiconductor device 650 according to a fourth embodiment of the present invention. The semiconductor device 650 is a vertical insulated gate bipolar transistor (IGBT) to which the drain trench 111 and field plate 114 according to the first embodiment are applied. In the first embodiment, the N⁻-type drift layer 102 or the like is formed on the N⁺-type semiconductor substrate 101. In contrast, in the semiconductor device 650 shown in FIG. 7, the N⁻-type drift layer 102 or the like is formed on a P⁺-type semiconductor substrate 1601. Except this, the first embodiment and the fourth embodiment are provided with similar structures. In FIG. 7, components identical or corresponding to those in FIGS. 1 to 6 are assigned identical reference numerals and description thereof will be omitted or simplified.

In other words, the semiconductor device 650 corresponds to the semiconductor device 100 according to the first embodiment with a P-type semiconductor layer inserted between the N⁻-type drift layer 102 and the drain electrode 110. However, since the drain is changed to a collector and the source is changed to an emitter, for example, the electrodes that correspond to the source electrode 109 and the drain electrode 110 function as an emitter electrode 1609 and a collector electrode 1610 respectively in the semiconductor device 650 which is an IGBT. In other aspects, in the descriptions of the first to third embodiments, the components such as the drain trench 111 and source trenches 301 and 501 may be read as "collector trench" and "emitter trench" respectively. The electric field can also be adjusted by the field plate 114 in the semiconductor device 650 as in the case described in the first embodiment. Therefore, it is possible to adjust the depletion layer by the PN junction and obtain similar effects about the feedback capacitance Cgd, output capacitance Coss, on-resistance and collector emitter current characteristic. The various modifications described in the first embodiment may be applied to the semiconductor device 650 or the source trenches 301 and 501 or the like may be applied to the semiconductor device 650 described in the second and third embodiments.

Fifth Embodiment

Figure 8:
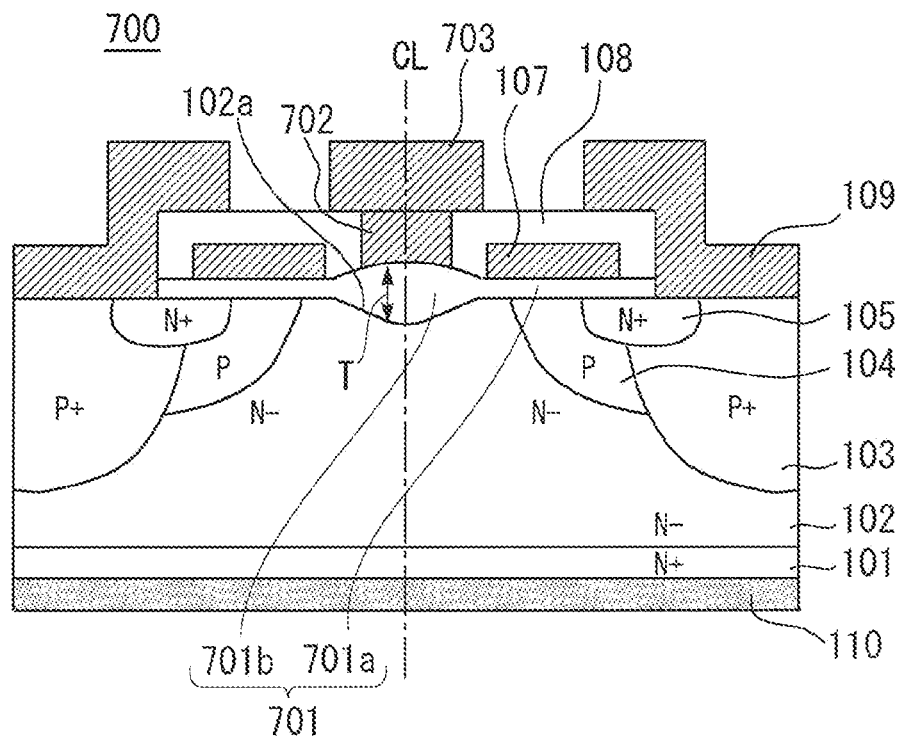
FIG. 8 is a cross-sectional view illustrating a semiconductor device according to a fifth embodiment of the present invention.
Figure 9:
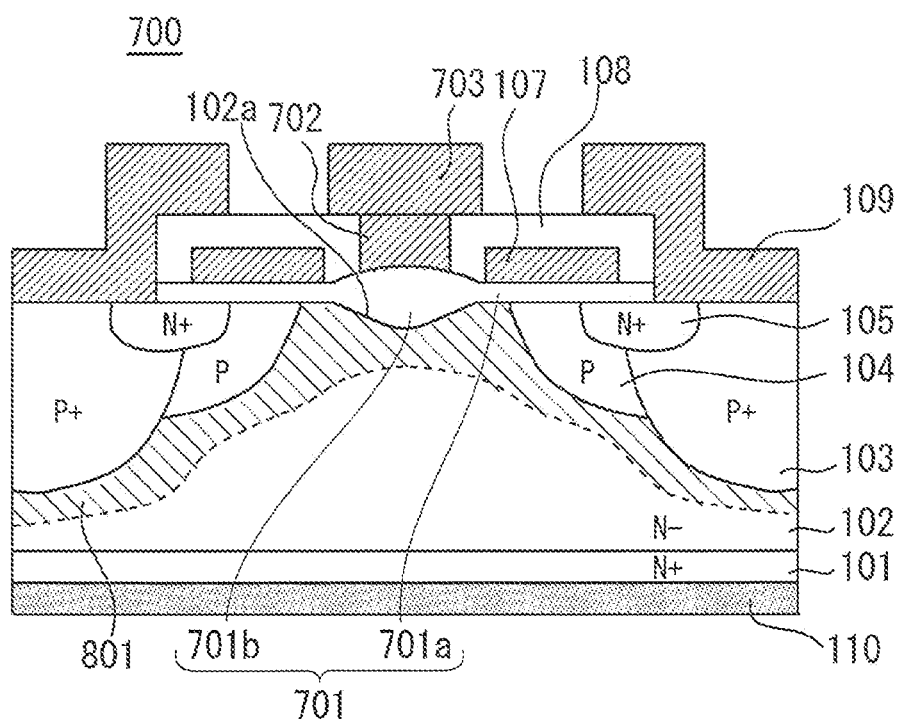
FIG. 9 is a cross-sectional view schematically illustrating a depletion layer formed in the semiconductor device according to the fifth embodiment of the present invention.

FIG. 8 is a cross-sectional view illustrating a semiconductor device 700 according to a fifth embodiment of the present invention. FIG. 9 is a cross-sectional view schematically illustrating a depletion layer 801 formed in the semiconductor device 700. The fifth embodiment is different from the first to fourth embodiments in the structure of the field plate. In the first to fourth embodiments, the field plate 114 is embedded in the drain trench 111 provided in the N⁻-type drift layer 102. In contrast, the semiconductor device 650 according to the fifth embodiment is provided with a flat surface field plate 702 without forming any trench in the N⁻-type drift layer 102. In FIG. 8 and FIG. 9, components identical or corresponding to those in FIG. 1 to FIG. 7 are assigned identical reference numerals and description thereof will be omitted or simplified.

The semiconductor device 700 has a layer structure similar to that described in the first to fourth embodiments except in that it is provided with a LOCOS oxide film 701, the field plate 702 and a field plate electrode 703. The LOCOS oxide film 701 is provided with a first part 701a located immediately below the gate electrode 107 and a second part 701b which is provided adjacent to the gate electrode 107 and formed to be thicker than the first part 701a. The gate electrode 107 is provided above the N⁻-type drift layer 102, P-type channel well region 104 and N⁺-type diffusion well region 105 with the first part 701a of the LOCOS oxide film 701 interposed therebetween. This first part 701a functions as a gate insulating film. The field plate 702 is provided above the N⁻-type drift layer 102 and adjacent to the gate electrode 107 with the second part 701b of the LOCOS oxide film 701 interposed therebetween. A thickness T of the second part 701b increases as the distance from the gate electrode 107 increases. The field plate 702 is obtained by opening the inter-layer film 108 above the second part 701b of the LOCOS oxide film 701 and embedding a conductive material here. As the conductive material of the field plate 702, for example, polysilicon or a high melting-point metal such as tungsten can be used. The field plate electrode 703 is formed on the field plate 702, electrically connected thereto and connected to the source electrode 109 at the same potential. Note that in the fifth embodiment, one continuous LOCOS oxide film 701 is provided with the first part 701a and second part 701b, but the present invention is not limited to this. The LOCOS oxide film 701 need not be one continuous insulating film, but insulating films may be formed at positions corresponding to the first part 701a and second part 701b respectively.

The depletion layer 801 shown in FIG. 9 is formed in the N⁻-type drift layer 102 when a positive voltage is applied to the drain electrode 110 and the source electrode 109 is grounded. The depletion of the N⁻-type drift layer 102 surface is promoted by the field plate 702 formed on the LOCOS oxide film 701. As the thickness T increases, the interval between the field plate 702 and the N⁻-type drift layer 102 increases in the vicinity of the gate electrode 107 and decreases at a position away from the gate electrode 107. This causes the electric field of the field plate 702 to act in a large scale in the vicinity of the gate electrode 107, act in a small scale in a place away from the gate electrode 107. It is thereby possible to adjust the operation of increasing the width of the depletion layer 801. It is possible to weaken the electric field by the field plate 702 in a place away from the gate electrode 107, weaken the expanding operation of the depletion layer 801 and thereby reduce the on-resistance Ron.

As the characteristic curves 12 and 22 shown in FIG. 10 and FIG. 11, the feedback capacitance Cgd and the output capacitance Coss can be made lower than the characteristic curves 11 and 21 of the first comparative example and the high frequency characteristic can be improved more than in the first comparative example. In the fifth embodiment, the thickness of the depletion layer 801 can be increased by promoting the depletion of the N⁻-type drift layer 102, and therefore it is possible to design the N⁻-type drift layer 102 with higher concentration. Thus, it is possible to reduce the on-resistance Ron and enable high output of the semiconductor device 700.

The depletion layer 801 is deeper than the depletion layer 1301 in the first comparative example (in other words, it is greater in the thickness direction of the N⁻-type drift layer 102), and has a great radius of curvature immediately below the gate electrode 107. By increasing the thickness of the second part 701b of the LOCOS oxide film 701, it is possible to reduce a parasitic capacitance generated between the field plate 702 and the N⁻-type drift layer 102.

Although the fifth embodiment uses the LOCOS oxide film 701, the present invention is not limited to this. A trench may be provided in the surface part of the N⁻-type drift layer 102 so as to form a concave part similar to a concave part 102a in FIG. 8, which becomes deeper as the distance from the gate electrode 107 increases. An insulating film may be embedded in this trench and this embedded insulating film may be used instead of the second part 701b.

The surface part of the N⁺-type drift layer 102 includes the concave part 102a below the field plate 702 which is more deeply caved in as the distance from the gate electrode 107 increases. The second part 701b is interposed between the concave part 102a and the field plate 702, and the second part 701b is thereby provided with a curved surface which is convex toward the N⁻-type drift layer 102 side. Since a LOCOS oxide film is formed by thermally oxidizing a semiconductor layer (silicon substrate) itself, the LOCOS oxide film grows on both sides; the front side and back side of the semiconductor layer. 55% of the film thickness of the LOCOS oxide film 701 grows above the original substrate and 45% grows below the surface of the substrate. A drain current flows horizontally through an electronic channel formed on the surface side of the P-type channel well region 104 and flows inside the N⁻-type drift layer 102 in the depth direction. If the LOCOS oxide film 701 has grown also in the lower part, it can provide a curvature to the current path and has an advantage of preventing scattering of carriers and enabling a high-speed operation.

As a preferable mode, the thickness T of the second part 701b continuously increases as the distance from the gate electrode 107 increases. More specifically, the second part 701b has a curved surface which is smoothly convex on the field plate 702 side. The reason that the thickness T preferably continuously increases is the same as the description in the first embodiment that the field plate 114 is preferably continuously tapered. The increase in the thickness T of the second part 701b is not necessarily limited to the shape of the curved surface and may be a tapered shape in which the second part 701b is linearly tapered in the cross-sectional view in FIG. 8. This modification of the tapered shape includes a flat slanting surface in which the second part 701b is convex toward the field plate 702 side. Although it is preferable that the thickness T increase continuously, the present invention is not limited to this and the thickness T of the second part 701b may increase step-wise.

Note that in the fifth embodiment, the field plate 702 is applied to a vertical MOSFET, but the present invention is not limited to this, and the field plate 702 is also applicable to an IGBT. Though not shown in the drawings, using a P⁺-type semiconductor substrate instead of the N⁺-type semiconductor substrate 101 in the semiconductor device 700, it is also possible to obtain an IGBT provided with the field plate 702. Moreover, the various modifications described in the fifth embodiment are likewise applicable to the IGBT having the field plate 702. This is similar to the case where an IGBT provided with the field plate 114 of the first embodiment is obtained using the P⁺-type semiconductor substrate 1601 in the fourth embodiment.

Note that although silicon is used as the semiconductor material in the aforementioned first to fifth embodiments, the present invention is not limited to this. A wideband gap semiconductor which has a greater band gap than silicon may also be used. More specifically, as a wideband gap semiconductor, for example, silicon carbide (SiC) or nitride gallium (GaN)-based material, which are compound semiconductor materials, or diamond may be used.

The features and advantages of the present invention may be summarized as follows. The first and second aspects of the present invention has improved the shape of the field plate, and can thereby weaken the depletion action in a region away from the gate electrode and reduce resistance thereof. This allows suppression of a feedback capacitance and an output capacitance to be compatible with low on-resistance.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-255382, filed on Dec. 17, 2014 including specification, claims, drawings and summary, on which the Convention priority of the present application is based, is incorporated herein by reference in its entirety.

What is claimed is:

1. A semiconductor device comprising:
   a drift layer made of a first conductive type semiconductor;
   a first electrode provided on a back side of the drift layer and electrically connected to the drift layer;
   a first well region provided on a surface part of the drift layer and made of a semiconductor of a second conductive type opposite to the first conductive type;
   a second well region provided on a surface part of the first well region and made of a semiconductor of the first conductive type;
   a second electrode electrically connected to the second well region;
   a gate electrode provided above the first and second well regions and the drift layer with a gate insulating film interposed between the gate electrode and the first and second well regions and the drift layer;
   a first trench which extends from a surface of the drift layer towards the first electrode along a direction perpendicular to a plane defined by the surface of the drift layer; and
   a single field plate embedded in the first trench, the field plate extending from above the surface of the drift layer to below the surface of the drift layer in cross-sectional view, that at a position above the surface of the drift layer the field plate is adjacent to the gate electrode in a direction parallel to the surface of the drift layer, an insulating film is interposed between the field plate and the first trench, and the field plate is electrically insulated from the gate electrode, wherein
   the field plate has a depth extending along a depth direction of the semiconductor device, the depth direction being perpendicular to a plane of the back side of the drift layer,
   the first trench includes a base part and a side wall extending along the depth direction,
   at least a majority of the field plate along its depth is continuously tapered toward the base part so as to weaken the depletion action in a region away from the gate electrode and reduce resistance thereof,
   the field plate has a flat bottom facing the base part,
   a side face of the field plate is a concave curved surface caved in toward a center of the field plate, such that a distance between the side wall and the side face of the field plate is increased toward the base part side, and
   the concave curved surface begins above the surface of the drift layer and continues to below the surface of the drift layer.

2. The semiconductor device according to claim 1, wherein the field plate is linearly tapered.

3. The semiconductor device according to claim 1, wherein the side face of the field plate is a curved surface.

4. The semiconductor device according to claim 1, wherein
   a second trench is provided in the first well region,
   a third well region of the second conductive type is formed by implantation of an impurity into a base part of the second trench, and
   the semiconductor device further comprises a trench electrode made of a conductive material embedded in the second trench and electrically connected to the second electrode.

5. The semiconductor device according to claim 4, wherein the second trench is deeper than the first trench.

6. The semiconductor device according to claim 4, further comprising a side face insulating film that covers a side face of the gate electrode,
wherein the trench electrode reaches the first well region from a position adjacent to the side face insulating film while contacting the second well region immediately below the side wall insulating film.

7. The semiconductor device according to claim 6, wherein a semiconductor layer of the second conductive type is provided between the drift layer and the first electrode.

8. The semiconductor device according to claim 4, wherein a semiconductor layer of the second conductive type is provided between the drift layer and the first electrode.

9. The semiconductor device according to claim 1, wherein a semiconductor layer of the second conductive type is provided between the drift layer and the first electrode.

10. The semiconductor device according to claim 1, wherein the field plate makes direct physical and electrical contact with a field plate electrode.

11. The semiconductor device according to claim 10, wherein the field plate is electrically connected so as to have the same electrical potential as the second electrode.

12. The semiconductor device according to claim 1, wherein the first trench does not extend to the back side of the drift layer.

13. The semiconductor device according to claim 1, wherein
the first trench makes no direct physical contact with the first well region; and
the first trench makes no direct physical contact with the second well region.

14. The semiconductor device according to claim 1, wherein
wherein the field plate makes direct physical and electrical contact with a field plate electrode;
the field plate is electrically connected so as to have the same electrical potential as the second electrode;
the first trench does not extend to the back side of the drift layer;
the first trench makes no direct physical contact with the first well region; and
the first trench makes no direct physical contact with the second well region.

15. A semiconductor device comprising:
a drift layer made of a first conductive type semiconductor;
a first electrode provided on a back side of the drift layer and electrically connected to the drift layer;
a first well region provided on a surface part of the drift layer and made of a semiconductor of a second conductive type opposite to the first conductive type;
a second well region provided on a surface part of the first well region and made of a semiconductor of the first conductive type;
a second electrode electrically connected to the second well region;
a gate electrode provided above the first and second well regions and the drift layer with a gate insulating film interposed between the gate electrode and the first and second well regions and the drift layer; and
a field plate embedded in a first trench, which extends from a surface of the drift layer towards the first electrode along a direction perpendicular to a plane defined by the surface of the drift layer, and is formed adjacent to the gate electrode on the surface of the drift layer with an insulating film interposed between the field plate and the first trench, and the field plate being applied a voltage different from that of the gate electrode, wherein
the first trench includes a base part and a side wall, the field plate is tapered toward the base part, a side face of the field plate is a concave curved surface caved in toward a center of the field plate, and a distance between the side wall and the side face of the field plate is increased toward the base part side, and
the concave curved surface begins above the surface of the drift layer and continues to below the surface of the drift layer.

* * * * *